(12) United States Patent
Shen et al.

(10) Patent No.: US 7,485,843 B2
(45) Date of Patent: Feb. 3, 2009

(54) TOUCH/PROXIMITY-SENSING USING REFLECTIVE OPTICAL SENSOR AND A LIGHT PIPE FOR SPECULARLY REFLECTING LIGHT

(75) Inventors: Sudy Shen, Richmond Hill (CA); Dan Praisler, Thornhill (CA)

(73) Assignee: Masstech Group Inc., Richmond Hill, Ontario ( * ) Notice: Subject to any disclaimer, the term of this patent is extended or adjusted under 35 U.S.C. 154(b) by 0 days.

(21) Appl. No.: 11/732,005

(22) Filed: Apr. 2, 2007

(65) Prior Publication Data
US 2007/0228263 A1    Oct. 4, 2007

Related U.S. Application Data

(60) Provisional application No. 60/788,325, filed on Mar. 31, 2006.

(51) Int. Cl.
*G01J 1/36* (2006.01)
(52) U.S. Cl. .................................. 250/227.22; 250/221
(58) Field of Classification Search ............ 250/227.22, 250/227.24, 227.25, 227.14, 221, 229, 214 AB; 340/555–557
See application file for complete search history.

(56) References Cited

U.S. PATENT DOCUMENTS

| | | | | | |
|---|---|---|---|---|---|
| 3,621,268 | A | * | 11/1971 | Friedrich et al. | ......... 250/214.1 |
| 3,937,952 | A | * | 2/1976 | Ripley et al. | ........... 250/227.22 |
| 5,103,085 | A | * | 4/1992 | Zimmerman | ................ 250/221 |

* cited by examiner

*Primary Examiner*—Que T Le
(74) *Attorney, Agent, or Firm*—Oppenheimer Wolff & Donnelly LLP

(57) ABSTRACT

The disclosure is directed to a touch proximity sensing system detecting the presence or absence of a triggering object. The system includes a reflective optical sensor, an active surface, and a light pipe in combination. The reflective optical sensor has an emitter for creating a light and a receiver for detecting a reflected light of the emitter. The active surface is suitable for receiving the triggering object, such as a stylus or finger, or the like. The light pipe is disposed between the reflective optical sensor and the active surface. The length of the light pipe is such that the reflective optical sensor and the active surface are spaced-apart from each other. The light pipe transports the light from the emitter to the active surface. In the presence of the triggering object, light from the emitter is reflected and the light pipe transports the reflected light to the receiver.

2 Claims, 2 Drawing Sheets

TOUCH/PROXIMITY-SENSING USING REFLECTIVE OPTICAL SENSOR AND A LIGHT PIPE FOR SPECULARLY REFLECTING LIGHT

CROSS REFERENCE TO RELATED APPLICATIONS

This application claims the benefit of U.S. Provisional Application No. 60/788,325, filed Mar. 31, 2006.

BACKGROUND

The present disclosure relates in general to optical sensing and more particularly to the use of reflective optical sensors. Reflective optical sensors are often used in input devices with closed surfaces without any mechanical components (i.e. buttons). Their purpose is to sense a movement in the proximity of the surface or a touch upon it and their range of sensitivity is generally limited. The inventive method and apparatus disclosed herein significantly extends the effective range of a reflective optical sensor making the sensing process almost independent from the shape and thickness of an input device's front surface, which allows greater flexibility in the mechanical design of the input device.

FIG. 1 illustrates a prior art reflective optical switch. A reflective optical sensor 1 contains an infra-red (IR) emitter 2 and a complementary IR receiver 3. The reflective optical sensor is positioned at a distance of 1 cm from a transparent active surface 4 which represents the maximum effective range of the reflective optic sensor. The effective range can be greater or lesser depending on the power and sensitivity of the IR emitter and receiver respectively, but in general for effective operation reflective optical sensors must be placed in close proximity to a transparent surface to facilitate the reflection and reception of emitted IR off of an approaching triggering object. A triggering object 5 is shown adjacent to the transparent surface at an active region, or at a position that leads to a successful reflection of IR light emitted by emitter 2 off of object 5 and back towards IR receiver 3. A successful reception of IR light by the receiver 3 generates an electrical signal which can be used to effect a change in the operation or status of an electronic device (not shown) connected to the reflective optical sensor. Triggering object 5 can be any manner of object having a surface which will reflect IR light but is typically a person's finger which has led to the description of such a reflective optical switch as "touch sensitive".

Reflective optical sensors used to sense movement in the proximity of the surface or to detect a touch of the surface near the sensor contain advantages over mechanical systems such as buttons. Mechanical systems are more prone to wear and tear because of their movement, and sensors can be used in connection with graphical user displays to promote flexibility in display design.

The physics of optical sensors, however, limits the range of the effective distance of the movement to the sensor. In general applications, the sensor must be most proximate to the surface in order for the sensor to detect a reflection. Accordingly, the design of such sensor systems is somewhat limited with respect to the positioning of the sensors and the thickness and shape of the touch surface. Accordingly, there is a need for a system of reflective optical sensors to break free of space and positioning constraints to permit innovative designs of touch sensor pads.

SUMMARY

The present disclosure is directed to a system that significantly extends the effective range of reflective optical sensors making the sensing system freeing up parts of design from the shape and thickness of the touch pad, and the distance of the optical sensor from the touch pad.

In one aspect, the disclosure is directed to a touch proximity sensing system detecting the presence or absence of a triggering object. The system includes a reflective optical sensor, an active surface, and a light pipe in combination. The reflective optical sensor has an emitter for creating a light and a receiver for detecting a reflected light of the emitter. The active surface is suitable for receiving the triggering object, such as a stylus or finger, or the like. The light pipe is disposed between the reflective optical sensor and the active surface. The length of the light pipe is such that the reflective optical sensor and the active surface are spaced-apart from each other. The light pipe transports the light from the emitter to the active surface. In the presence of the triggering object, light from the emitter is reflected and the light pipe transports the reflected light to the receiver.

In another aspect, the disclosure is directed to a touch proximity sensing system detecting the presence or absence of a triggering object for effecting a change in a device. The system includes a reflective optical sensor, a light pipe, and a translucent active member. The reflective optical sensor has an emitter that creates a subject light and a receiver that detects at least a selected amount of the subject light. The detection of the at least a selected amount of light effects a change in the device. The light pipe includes first and second ends such that light enters one end and is transported to the other end. The first end of the light pipe is disposed near the reflective optical sensor for receiving and transporting the subject light along the length of the light pipe. The translucent active member has an inner surface that is positioned next to the second end of the light pipe and also has an active surface opposite the inner surface. The second end of the light pipe is positioned near the inner surface and on an active region of the active member. The presence of the triggering object on or near the active region causes a reflection of the selected amount of the subject light to be transported along the light pipe to the receiver. And the absence of the triggering object at or near the active region does not cause the selected amount of the subject light to be transported along the light pipe to the receiver.

DESCRIPTION

This disclosure relates to a system to permit the remote positioning of reflective optical sensors from their corresponding touch/proximity surface. The disclosure, including the figures, describes the system with reference to illustrative examples. Other examples are contemplated and are mentioned below or are otherwise imaginable to someone skilled in the art. For example, the reflective optical sensors are indicated as using infra-red light. Infra-red light, however, is used in only example sensors, and other forms of light can be used in such sensors, which are both known and unknown at the time of this disclosure. Also, the system is illustrated in the example as using an optical structure referred to as a "light pipe." In some contexts, the term "light pipe" is used to mean a particular structure to the exclusion of all others. This disclosure does not intend for the term light pipe to be so limiting. Instead, the term "light pipe" can be used to mean any optical structure used to transport light from one end to the other end of the optical structure. Further, the scope of the invention is not limited to the few examples, i.e., the described embodiments of the invention. Rather, the scope of the invention is defined by reference to the appended claims. Changes can be made to the examples, including alternative designs not disclosed, and still be within the scope of the claims.

Figure 2:
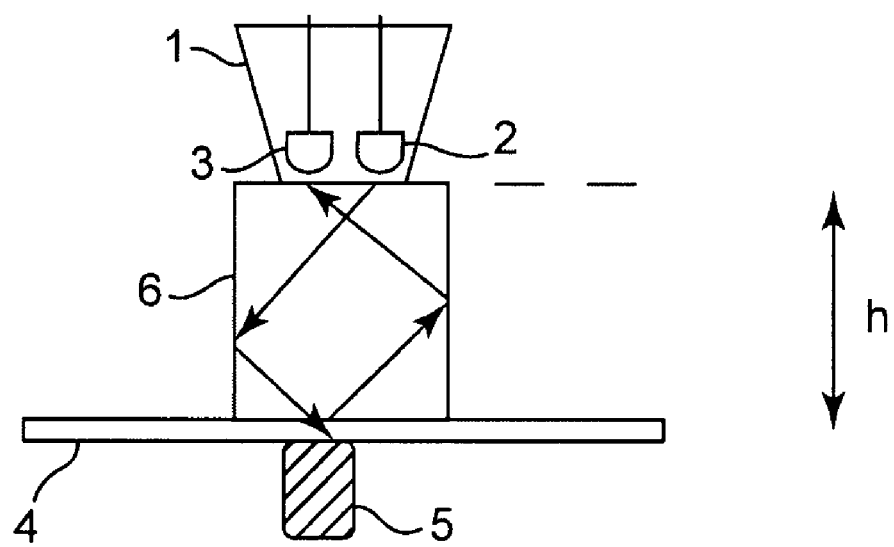
FIG. 2 is a schematic diagram of a touch/proximity sensor system of the present disclosure.

FIG. 2 is a schematic representing the inventive remote sensing switch which includes a light pipe 6 adjacent to the front surface of the reflective optical sensor 1 and the inside of the transparent active surface 4. Light pipe 6 can be of arbitrary length, h, and not affect the successful operation of the reflective optical sensor 6 since the emitted IR reflects off of the inner faces of the light pipe in both directions from transmitter to object and from object to receiver. Experiments have determined that a light pipe up to 10 cm in length can be used effectively in a reflective optical switch. In a preferred embodiment the light pipe is made from transparent acrylic and the reflective optical sensor is model number TCND3000 manufactured by Vishay Intertechnology of Malvern, Pa., although it is possible to use other materials for the light pipe and other models of reflective optical sensors.

Figure 1:
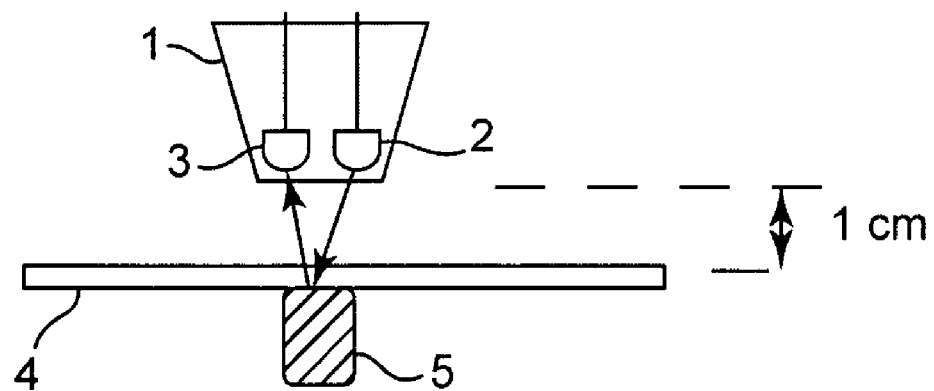
FIG. 1 is a schematic diagram of an example prior art touch/proximity sensor using a reflective optical switch.

FIG. 2 describes an example system of the present disclosure where like parts in common with the example of FIG. 1 are given like reference numbers. The reflective optical sensor 1 includes an emitter 2 and a receiver 3. Light from the emitter 2 (a light source created by the emitter) is transported along the light pipe 6 to the touch/proximity active surface 4. The active surface is at least translucent, or preferably and more particularly transparent to allow the light from the emitter to pass through it such that only an insignificant amount of light is reflected back toward the receiver 3, i.e., an amount of light not effective to generate an electrical signal to effect a change in the operation or status of a device connected to the sensor 1. In the absence of a triggering object 5, much of the light from the emitter is passed through the active surface 4 and into space. In the presence of the triggering object 5, however, the light from the emitter 2 passes along the indicated arrows and a significant amount of light, i.e., the reflected light of the emitter, is reflected off of the triggering object 5, back through the length h of the light pipe 6 along the return arrows in the figure and onto the receiver 3 where it is detected as the reflected light of the emitter.

In the preferred example of FIG. 2, the light pipe 6 is shown adjacent to, or pressed against, both the optical sensor 1 and the touch/proximity surface 4 such that light passes directly from the optical sensor 1 into the light pipe 6 and vice versa, and light passes directly from the light pipe 6 into the touch/proximity medium and vice versa. Other examples are contemplated such as the optical sensor 1 and/or the touch/proximity surface 4 being slightly spaced-apart from the light pipe 6 leaving a translucent gap between the items.

The light pipe 6 can be any suitable article or device used to transport, or guide, an appropriate amount of light along its length h to work in the system. The light pipe can be hollow or solid, and generally transparent or covered. In the case of a hollow light pipe, the internal surface of the pipe can include a prismatic optical film. The light pipe can operate under the principles of total internal reflection (TIR) or can include an internally mirrored surface to specularly reflect at least some of the light along its length h. In general, the light pipe is used to guide as much light as possible from one end to the other in order to save power provided to the sensor 1. Accordingly, the light pipe reflects as much light as possible and does not provide for distribution of light through the light pipe along its length h. But design examples are contemplated also incorporating the light distribution feature. The shape of the light pipe 6 can also be any suitable shape such as prismatic, cylindrical, conical, or other effective three dimensional shapes.

Some absorption of the light from the emitter will occur in the system, and the designer should take into account the amount of absorption in the design of the touch proximity sensing system. For example, the touch proximity system includes absorption of light by the triggering object and light passing through the active surface even in the presence of the triggering object. In addition, the system can absorb or lose light through the light pipe 6. Total internal reflection light pipes generally provide very efficient articles to transport light, and transport nearly all of the light. Coated or mirrored surfaces inside the light pipe creating reflection for transport are generally less efficient, and the designer should consider the amount of light absorbed in the light pipe as one factor to determine the maximum length of the light pipe to be able to provide the reflected light of the emitter to the receiver 3.

The use of a light pipe combined with a reflective optical sensor provides flexibility in the mechanical design of the reflective optical switch and the electronic device of which it is part. The light pipe allows a designer to pull the sensor back from the front of the device thereby providing additional mechanical design space near the front which can lead to simpler and less expensive designs. A further possibility is to use the additional mechanical design space to enhance the appearance or aesthetics of the switch, for example by placing LEDs proximate to the transparent front surface to provide a back lit touch sensitive control panel. The positional flexibility advantage of the invention further creates the possibility to apply reflective optical sensing to a much wider range of devices.

Figure 3:
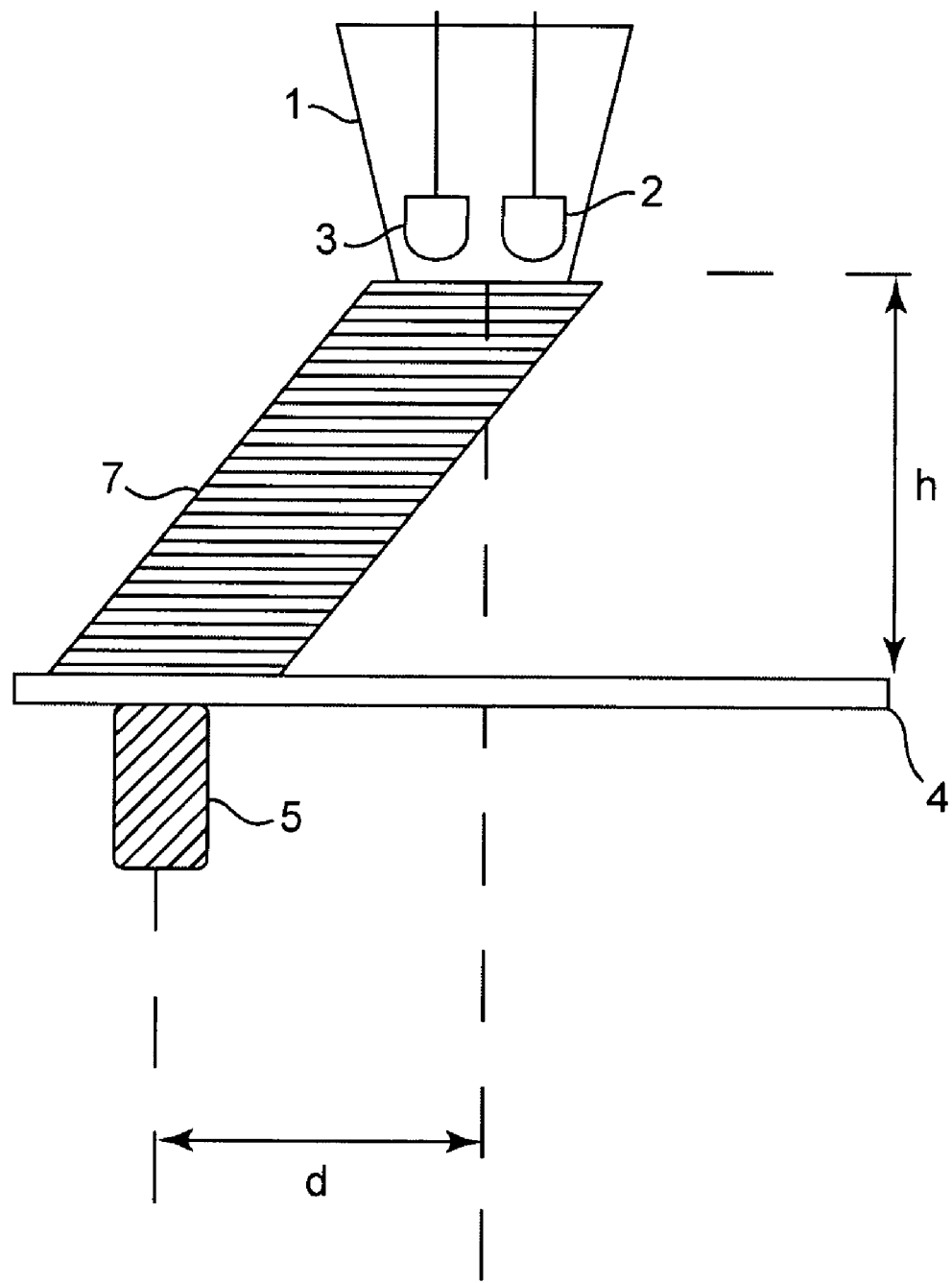
FIG. 3 is a schematic diagram of another touch/proximity sensor system of the present disclosure.

FIG. 3 illustrates another example. There, light pipe 7 features a parallelogram profile (as seen in plan) which allows the reflective optical sensor 1 to be offset laterally from the triggering object 5 as well as offset in depth from the transparent surface 4. This arrangement further increases the flexibility of the placement of the reflective optical sensor and provides correspondingly greater mechanical design freedom. The light pipe profile could be other shapes as well, for example it could be curvilinear allowing for the placement of the reflective optical sensor orthogonal to the axis of the approaching triggering object. The cross sectional shape of the light pipe can be rectangular, circular, elliptical or any other suitable shape so long as it provides sufficient coverage on the face of the reflective optical sensor.

What is claimed is:

1. A touch proximity sensing system detecting the presence or absence of a triggering object, the system comprising:
    a reflective optical sensor having an emitter for creating a light and a receiver for detecting a reflected light of the emitter;
    an active surface for receiving the triggering object; and
    a light pipe disposed between the reflective optical sensor and the active surface, the light pipe having a first end adjoining the reflective optical sensor and a second end adjoining the active surface, and the light pipe having a length such that the reflective optical sensor and the active surface are spaced-apart from each other over the length of the light pipe;

wherein the light pipe specularly reflects the light from the emitter adjoining the first end along the length of the light pipe to the active surface adjoining to the second end;

and wherein in the presence of the triggering object, the light pipe specularly reflects the light from the active surface adjoining the second end along the length of the light pipe to the receiver adjoining the first end, causing the reflected light to be transported from the active surface to the receiver to detect the presence of the trigger object.

2. A touch proximity sensing system detecting the presence or absence of a triggering object for effecting a change in a device, the system comprising:

a reflective optical sensor having an emitter for creating a subject light and a receiver for detecting at least a selected amount of the subject light, wherein detection of the at least a selected amount of light effects a change in the device;

a light pipe having a length and first and second ends, wherein light entering one end is transported to the other end via specular reflection, wherein the first end is disposed proximate the reflective optical sensor for receiving and transporting the subject light along the length of the light pipe;

a translucent active member having an inner surface disposed proximate the second end of the light pipe and having an active surface opposite the inner surface, wherein the second end of the light pipe is disposed proximate the inner surface and on an active region of the active member;

wherein the presence of the triggering object proximate the active region causes a reflection of at least the selected amount of the subject light to be transported along the light pipe to the receiver via specular reflection and the absence of the triggering object proximate the active region does not cause at least the selected amount of the subject light to be transported along the light pipe to the receiver.

* * * * *